(12) United States Patent
Tokuda et al.

(10) Patent No.: US 8,405,037 B2
(45) Date of Patent: Mar. 26, 2013

(54) RADIATION DETECTOR MANUFACTURING METHOD, A RADIATION DETECTOR, AND A RADIOGRAPHIC APPARATUS

(75) Inventors: Satoshi Tokuda, Kasatsu (JP); Hiroyuki Kishihara, Kizugawa (JP); Masatomo Kaino, Kyoto (JP); Tamotsu Okamoto, Kisarazu (JP)

(73) Assignees: Shimadzu Corporation, Kyoto (JP); Institute of National Colleges of Technology, Japan, Tokyo (JP)

( * ) Notice: Subject to any disclaimer, the term of this patent is extended or adjusted under 35 U.S.C. 154(b) by 309 days.

(21) Appl. No.: 12/867,229

(22) PCT Filed: Feb. 12, 2008

(86) PCT No.: PCT/JP2008/052250
§ 371 (c)(1),
(2), (4) Date: Aug. 11, 2010

(87) PCT Pub. No.: WO2009/101670
PCT Pub. Date: Aug. 20, 2009

(65) Prior Publication Data
US 2010/0327172 A1    Dec. 30, 2010

(51) Int. Cl.
*G01T 1/20* (2006.01)
(52) U.S. Cl. .................. 250/370.12; 250/371
(58) Field of Classification Search ............ 250/370.01, 250/370.11, 370.12, 370.13, 371
See application file for complete search history.

(56) References Cited

U.S. PATENT DOCUMENTS

| 6,512,233 | B1 | 1/2003 | Sato et al. |
| 2004/0094721 | A1 | 5/2004 | Tokuda et al. |
| 2005/0170649 | A1 | 8/2005 | Hirano |

FOREIGN PATENT DOCUMENTS

| EP | 0 853 345 A1 | 7/1998 |
| FR | 2 793 351 A1 | 11/2000 |
| JP | 5-155699 A | 6/1993 |
| JP | 7-69798 A | 3/1995 |
| JP | 10-303441 A | 11/1998 |
| JP | 2001-242255 A | 9/2001 |
| JP | 2003-277197 A | 10/2003 |
| JP | 2004-172377 A | 6/2004 |
| WO | WO 0068999 A1 * | 11/2000 |

OTHER PUBLICATIONS

International Search Report for the Application No. PCT/JP2008/052250 mailed Mar. 25, 2008.
Supplementary European Search Report for the Application No. EP 08 71 1114 dated Apr. 18, 2011.

* cited by examiner

*Primary Examiner* — Mark R Gaworecki
(74) *Attorney, Agent, or Firm* — Cheng Law Group, PLLC (57) ABSTRACT

A radiation detector of this invention includes a Cl-doped CdTe or Cl-doped CdZnTe polycrystalline semiconductor film in which defect levels in crystal grains are protected. This is obtained by grinding CdTe or CdZnTe crystal doped with Cl, and preparing the polycrystalline semiconductor film again by using its powder as the source. The defect levels of crystal grain boundaries in the polycrystalline semiconductor film are also protected by further doping the polycrystalline semiconductor film prepared again with Cl. These features enable manufacture of the radiation detector which has excellent sensitivity and response to radiation.

10 Claims, 5 Drawing Sheets

X-ray response waveforms in conventional example

Fig.5

X-ray response waveforms in this embodiment

Fig.6 conversion layer applied electric field dependence of
X-ray sensitivity

Fig.7

RADIATION DETECTOR MANUFACTURING METHOD, A RADIATION DETECTOR, AND A RADIOGRAPHIC APPARATUS

TECHNICAL FIELD

This invention relates to a radiation detector manufacturing method, a radiation detector and a radiographic apparatus for industrial or medical use, and more particularly to a construction of and a method of manufacturing a semiconductor layer for detecting radiation.

BACKGROUND ART

A conventional, radiation detector, for example, has a single crystal body of CdTe or CdZnTe used for a conversion layer sensitive to radiation. Since these single crystal bodies have wide gaps and are formed of heavy elements, the product can operate at room temperature and has a characteristic of being highly sensitive. However, it is very difficult in production of an ingot to grow a single crystal of large area for two-dimensional imaging. Furthermore, a two-dimensional image detector cannot be produced since material cost of a single crystal body becomes unrealistically high, and a crystal defect in even part of the single crystal body would make it impossible to obtain a pixel in that location.

On the other hand, a polycrystalline semiconductor film of CdTe or CdZnTe formed by the CVD method, PVD method or the like includes many crystal grain boundaries, and is inferior to a single crystal body in electrical and radiation detecting characteristics. In use as a radiation detector for an X-ray area, in order to absorb X-rays, a thickness of several hundred micrometers is needed as thickness of a detecting layer. Even if signal charges are collected from X-ray irradiation by applying a bias voltage to the detecting layer of such thick polycrystalline film, sensitivity and response will fall remarkably due to the generated electric charges being captured by the grain boundaries and the like in the polycrystalline film.

Then, attempts have been made to improve carrier mobility by doping a CdTe or CdZnTe polycrystalline semiconductor film with a halogen such as Cl, thereby to improve detection characteristics with respect to light or radiation of the polycrystalline semiconductor film.

As disclosed in Patent Document 1, for example, a polycrystalline semiconductor film or polycrystalline semiconductor laminated film is formed by vapor deposition or sublimation technique from a source consisting of a mixture of a first material including at least one of CdTe, ZnTe and CdZnTe and a second material including at least one of $CdCl_2$ or $ZnCl_2$. Consequently, the polycrystalline semiconductor film consisting of at least one of CdTe, ZnTe and CdZnTe can be doped with Cl, and the defect level of crystal grain boundaries is protected by Cl, to improve radiation detecting characteristics. With this method, the defect level of crystal grain boundaries in the interior of the polycrystalline semiconductor film can also be protected.

[Patent Document 1]
Japanese Unexamined Patent Publication No. 2004-172377

DISCLOSURE OF THE INVENTION

Problem to be Solved by the Invention

However, even with the technique disclosed in Patent Document 1, the detection characteristics with respect to light or radiation are inferior, compared with a semiconductor film prepared from a single crystal. Sufficient radiation detection characteristics needed cannot be acquired only by protecting the defect level of crystal grain boundaries with Cl using the conventional technique.

This invention has been made having regard to the state of the art noted above, and its object is to provide a radiation detector manufacturing method, a radiation detector and a radiographic apparatus, in which the defect level of crystals in a polycrystalline semiconductor film is protected to realize improved sensitivity and response to radiation.

Means for Solving the Problem

Inventor has made intensive research and attained the following findings. That is, if not only crystal grain boundaries but crystal grains in a polycrystalline semiconductor film can be doped with Cl atoms, the defect levels of point defects and line defects in the crystal grains also can be protected. Then, by doping the polycrystalline semiconductor film with Cl atoms by a different method, the detection characteristics with respect to light or radiation that cannot be acquired from the conventional polycrystalline semiconductor film can be realized.

To fulfill the above object, this invention provides the following construction.

A radiation detector manufacturing methods of this invention comprises a first powder preparing step for preparing a first powder by grinding CdTe crystal doped with Cl or CdZnTe crystal doped with Cl, and a polycrystalline semiconductor film forming step for forming a polycrystalline semiconductor film, by vapor deposition or sublimation method using the first powder as a source, from at least one of Cl-doped CdTe or Cl-doped CdZnTe, the polycrystalline semiconductor film serving as a radiation conversion layer.

According to the radiation detector of this invention. CdTe crystal or CdZnTe crystal already doped with Cl is ground into powder which is used as a material for forming the polycrystalline semiconductor film. Thus, the defect level in crystal grains is effectively compensated by grinding the material already doped with Cl and forming the polycrystalline semiconductor film again, thereby to provide excellent sensitivity and response to radiation.

In the method of forming the polycrystalline semiconductor film, the first powder preparing step may use a mixture prepared by adding, as a second powder, one of $CdCl_2$ and $ZnCl_2$ which is a Cl-doped first auxiliary material to be used as the source, and the polycrystalline semiconductor film may be formed by vapor deposition or sublimation method from at least one of Cl-doped CdTe or Cl-doped CdZnTe. Consequently, in addition to being excellent in sensitivity and response to radiation, low noise and excellent S/N are provided since the defect level in crystal grains is effectively compensated.

Further, Cl-doped CdZnTe polycrystalline semiconductor film may be formed by vapor deposition or sublimation method using, as the source, a mixture prepared by adding to the first powder the second powder and a third powder which is one of Zn, ZnTe and $ZnCl_2$ to serve as a Zn-doped second auxiliary material, or using, as the source, a mixture prepared by adding only the third powder to the first powder. Consequently, not only being excellent in S/N, but dark current can be further reduced.

A vapor including Cl atoms may be supplied to the polycrystalline semiconductor film prepared by the above method, whereby the polycrystalline semiconductor film is further doped with Cl. Consequently, since Cl atoms in the vapor phase state further dope the polycrystalline semiconductor film after formation of the polycrystalline semiconductor film, crystal grain boundaries in the polycrystalline semiconductor film are further protected by Cl. Even when the thickness of the polycrystalline semiconductor film is thick, the defect level of crystal grain boundaries is effectively compensated, and noise can be reduced further.

In one example of the invention relating to the above radiation detector manufacturing method, heat treatment is performed in an arbitrary atmosphere for a powder of $CdCl_2$ or $ZnCl_2$ or a sintered body thereof placed opposite the polycrystalline semiconductor film. In addition, the arbitrary atmosphere in which the heat treatment is performed is a mixed atmosphere formed of one or at least two or more of a rare gas, $N_2$, $O_2$ and $H_2$. Where a rare gas is used, He, Ne or Ar is generally used.

A radiation detector of this invention comprises, as a radiation conversion layer, a polycrystalline semiconductor film formed by vapor deposition or sublimation method using, as a source, a powder prepared from at least one of Cl-doped CdTe or Cl-doped CdZnTe, the powder being prepared by grinding CdTe crystal doped with Cl or CdZnTe crystal doped with Cl.

According to the radiation detector of this invention, CdTe crystal or CdZnTe crystal already doped with Cl is ground into powder, and this powder is used as a source for forming again the polycrystalline semiconductor film to act as the radiation conversion layer. Consequently, the defect level in crystal grains is effectively compensated, thereby to provide excellent sensitivity and response to radiation.

A radiographic apparatus of this invention comprises a radiation detector having the above characteristics, charge storage capacity elements for storing electric charges generated by a radiation conversion layer of the radiation detector switching elements electrically connected to the charge storage capacity elements; a drive circuit for causing switching operation through electrode wiring connected to the switching elements; and a readout circuit for reading the electric charges stored in the charge storage capacity elements through electrode wiring connected to the switching elements, wherein the charge storage capacity elements and the switching elements are arranged in a two-dimensional array.

According to the radiographic apparatus of this invention, high-quality radiological images excellent in sensitivity and response to radiation can be acquired.

Effects of the Invention

According to the radiation detector manufacturing method, the radiation detector and the radiographic apparatus of this invention, the defect level in crystal grains existing in a polycrystalline semiconductor film can be effectively protected by Cl, by forming the polycrystalline semiconductor film using, as a source, a powder made by grinding Cl-doped CdTe crystal or Cl-dope CdZnTe crystal. Further, the defect level of crystal grain boundaries can also be protected effectively by further doping with Cl using a different technique which mixes an auxiliary material including Cl atoms into the source for forming the polycrystalline semiconductor film, or dopes the formed polycrystalline semiconductor film with Cl atoms in a vapor phase state. These features realize the radiation detector and high image quality radiographic apparatus excellent in sensitivity and response to the radiation, in noise and in S/N.

DESCRIPTION OF REFERENCES 1 radiation detector
3 support substrate
5 common electrode
7 electron or hole blocking layer
8 conversion layer
9 pixel electrodes

[Embodiment]

An embodiment of this invention will be described hereinafter with reference to the drawings.

Figure 1:
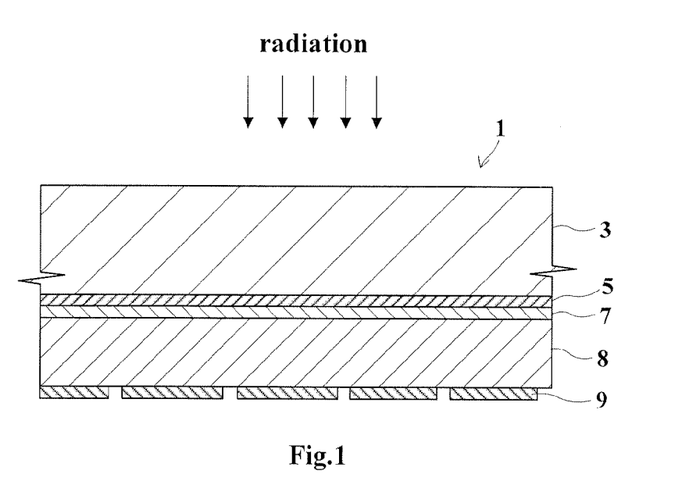
FIG. 1 is a view in vertical section showing a construction of a radiation detector according to an embodiment.
Figure 2:
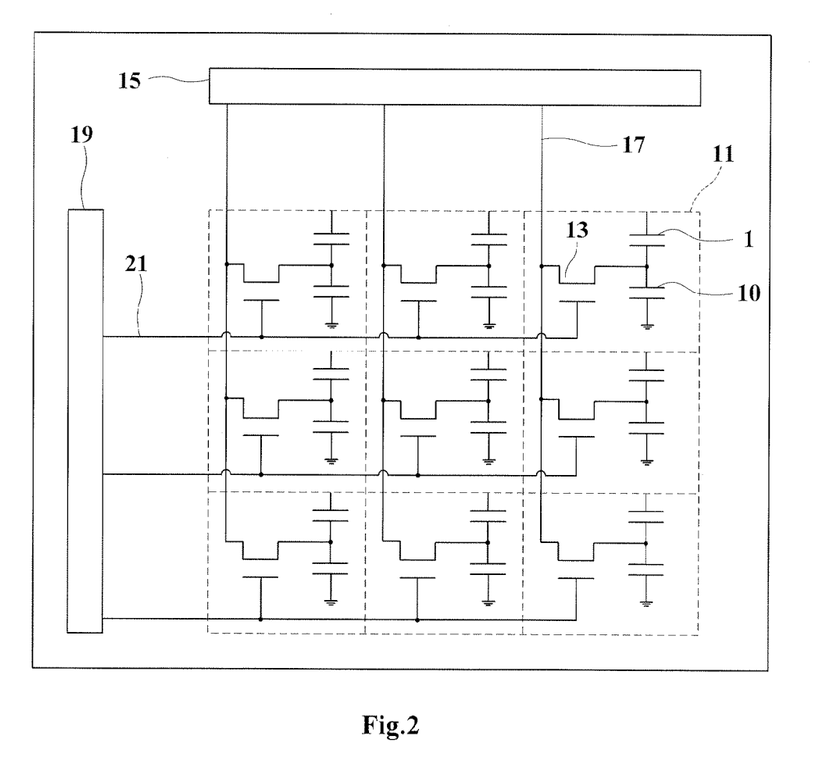
FIG. 2 is a circuit diagram showing a construction of an active matrix substrate and peripheral circuits.
Figure 3:
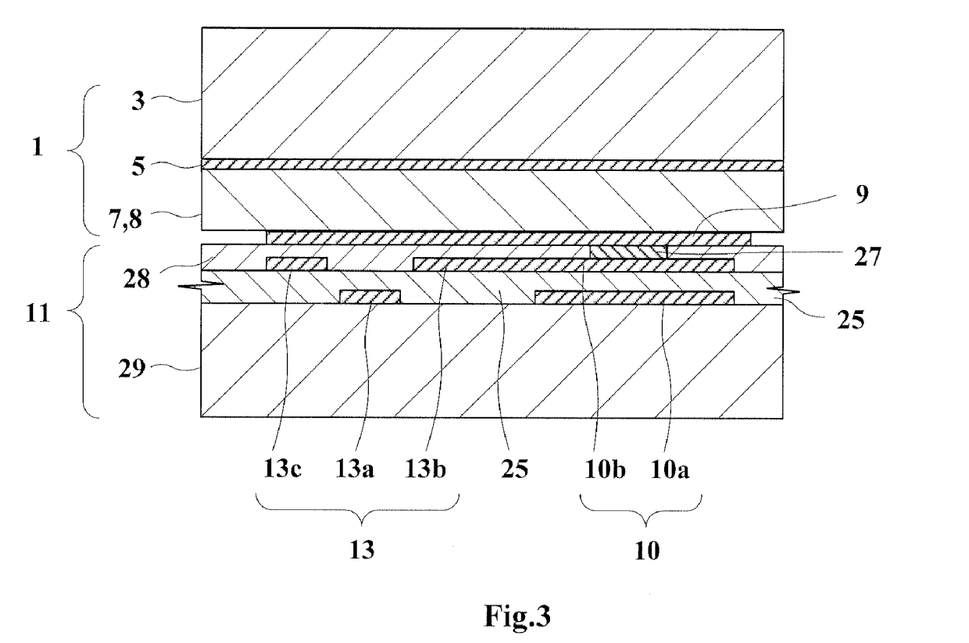
FIG. 3 is a side view showing an outline construction of a two-dimensional image detector.
Figure 4:
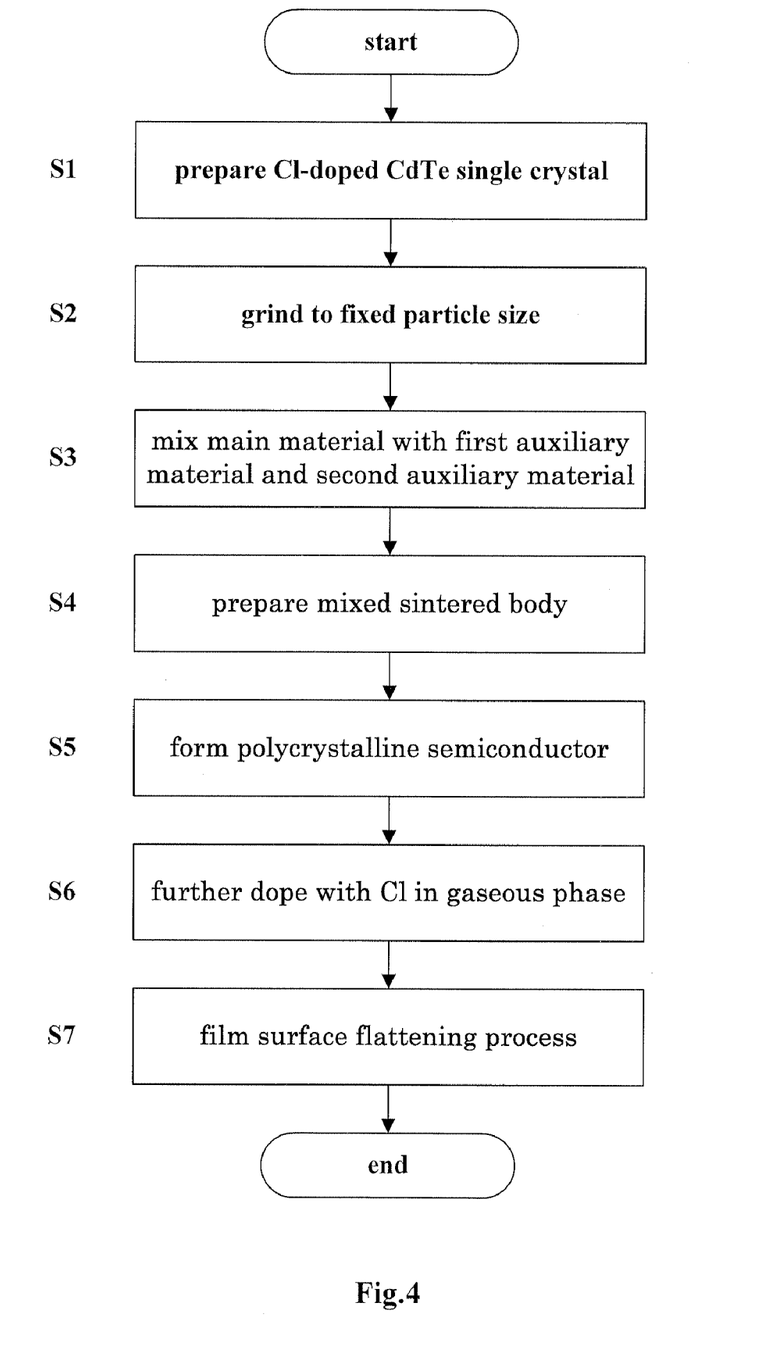
FIG. 4 is a flow chart showing a sequence of preparing a radiation conversion layer.
Figure 5:
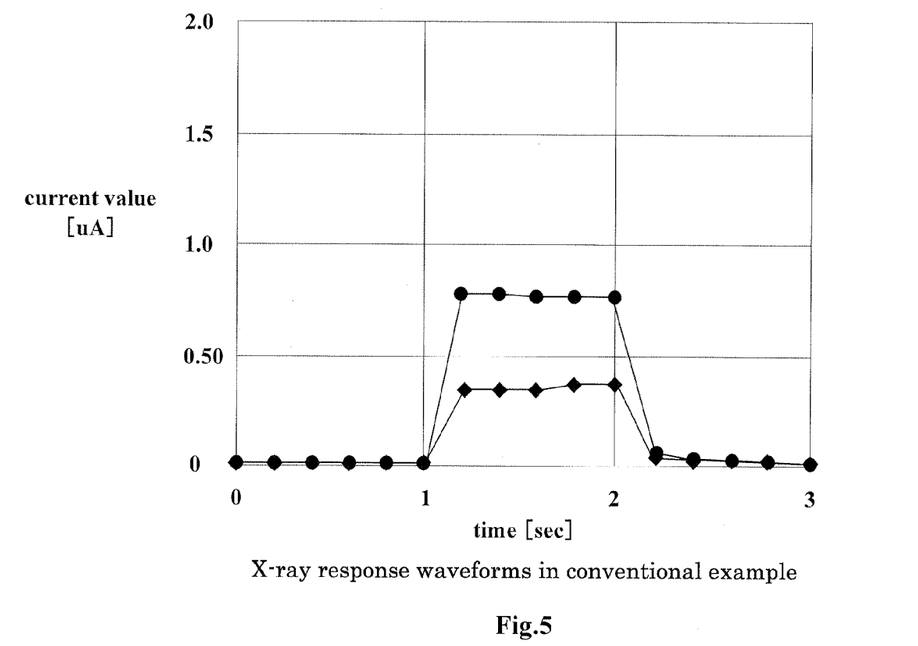
FIG. 5 is a characteristic view of X-ray response waveforms in a conventional example.
Figure 6:
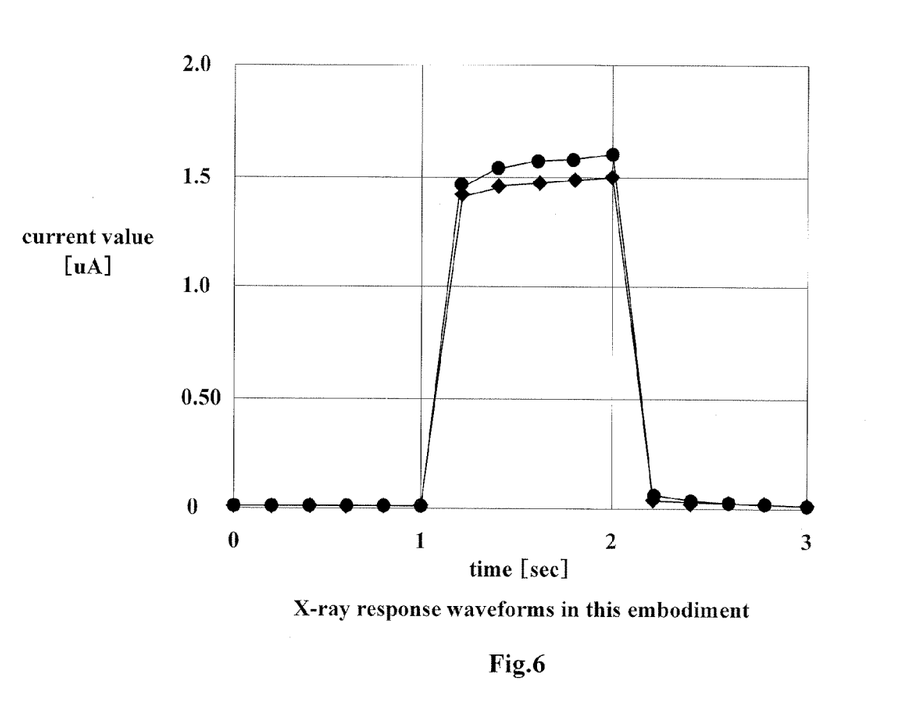
FIG. 6 is a characteristic view of X-ray response waveform in this embodiment.
Figure 7:
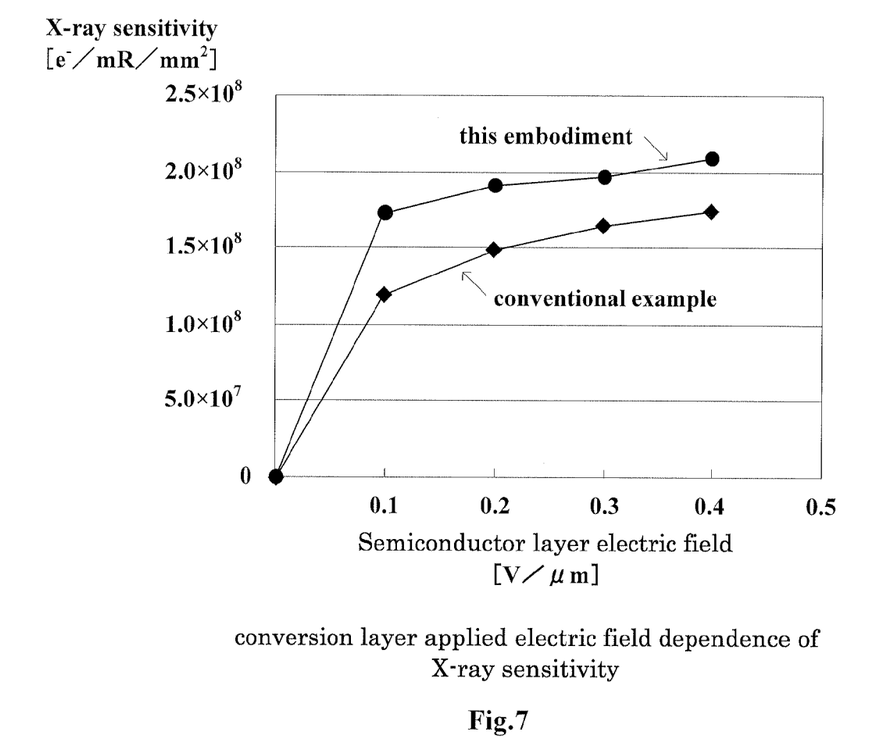
FIG. 7 is a characteristic view of conversion layer applied electric field dependence of X-ray sensitivity.

FIG. 1 is a view in vertical section showing a construction of a radiation detector according to the embodiment, FIG. 2 is a circuit diagram showing a construction of a radiographic apparatus including an active matrix substrate and peripheral circuits electrically connected to the radiation detector. FIG. 3 is a side view showing a vertical section of a two-dimensional image detector. FIG. 4 is a flow chart showing a sequence of preparing a radiation conversion layer. FIGS. 5 through 7 are characteristic views of radiation conversion layers of radiation detectors.

A radiation detector 1 formed of a common electrode 5 for bias voltage application laminated on a lower surface of a support substrate 3 capable of transmitting radiation, an electron or hole blocking layer 7 further laminated on a lower surface thereof, a conversion layer 8 further laminated on a lower surface thereof for generating electron-hole pair carriers in response to incident radiation, and carrier-collecting pixel electrodes 9 further laminated on a lower surface thereof.

The above support substrate 3, preferably, has a small radiation absorbing coefficient, and materials such as glass, ceramic ($Al_2O_3$, AlN), graphite and silicon, for example, are employable therefor. In the case of materials, such as graphite and silicon, having small radiation absorbing coefficients and being electrically conductive, the common electrode 5 may be omitted. In this embodiment, as shown in FIG. 1, radiation is incident on the construction from the side of the support substrate 3. In order to collect electric charges generated by radiation emission efficiently in the pixel electrodes 9, operation is carried out in the state of a bias voltage applied to the common electrode 5.

The conversion layer 8, preferably, is manufactured as described hereinafter, which is formed of a polycrystalline semiconductor film consisting of CdTe or CdZnTe, or a polycrystalline semiconductor laminated film including at least one of them, and is further doped with Cl.

The common electrode 5 and pixel electrodes 9 are formed of an electrically conductive material such as ITO, Au or Pt, for example. The electron or hole injection blocking layer 7 may, for example, be a $Sb_2Te_3$, $Sb_2S_3$ or ZnTe film for a p-type layer, and a CdS or ZnS film for a n-type layer.

As shown in FIGS. 2 and 3, the radiation detector 1 having the above construction is integrated with an active matrix substrate 11 to function as a two-dimensional image detector. Consequently, the carriers generated in the conversion layer 8 of the radiation detector 1 are collected on a pixel element basis by the active matrix substrate 11, and are stored for different pixel elements to be read as electric signals.

The active matrix substrate 11, as shown in FIG. 2, include charge storage capacity elements 10 for storing electric charges generated in the conversion layer 8 between reading cycles, and thin-film transistors 13 acting as switching elements for reading the electric charges stored. These charge storage capacity elements 10 and thin-film transistors 13 are arranged for respective rectangular pixels. For expediency of description, FIG. 2 shows a matrix of 3×3 pixels. In practice, however, the active matrix substrate used has a size corresponding to the number of pixels of the radiation detector 1. The thin-film transistors 13 correspond to the switching elements in this invention.

Further, the active matrix substrate 11 has a readout circuit 15 and a gate drive circuit 19. The readout circuit 15 is connected to vertical data wires 17 each linking drain electrodes 13c (FIG. 3) of the thin-film transistors 19 in the same column. The gate drive circuit 19 is connected to horizontal gate wires 21 each linking gate electrodes 13a (FIG. 3) of the thin-film transistors 19 in the same row. The gate wires 21 and data wires 17 respectively extend in directions of the rows and columns of the pixels, and cross each other at right angles. Although not shown, the readout circuit 15 includes a preamplifier connected to each data wire 17. The data wires 17 and gate wires 21 correspond to the electrode wires in this invention. The gate drive circuit 19 corresponds to the drive circuit in this invention.

Unlike the above, a construction having the readout circuit 15 and gate drive circuit 19 integrated with the active matrix substrate 11 may be used.

A detailed structure of the active matrix substrate 11 is shown in FIG. 3. That is, grounding electrodes 10a of the charge storage capacity elements 10 and gate electrodes 13a of the thin-film transistors 13 are laminated on the upper surface of an insulating substrate 29. Further thereon, capacity electrodes 10b of the charge storage capacity elements 10 and source electrodes 13b and drain electrodes 13c of the thin-film transistors 13 are laminated and formed through an insulating film 25. Further, the upper surfaces thereof, except connections to the pixel electrodes 9, are covered with an insulating film 28 for protection.

The grounding electrodes 10a of the charge storage capacity elements 10 are grounded. The capacity electrodes 10b and source electrodes 13b are formed simultaneously and are made conductive. As the insulating films 25 and 28, plasma SiN film is employable, for example. The radiation detector 1 and active matrix substrate 11 are positionally adjusted, and the pixel electrodes 9 and capacity electrodes 10b of the charge storage capacity are positionally adjusted, which are connected together by pressure bonding, with an interposition of carbon bump electrodes 27 formed by screen printing. Consequently the radiation detector 1 and active matrix substrate 11 are bonded together to be integral with each other. At this time, the picture electrodes 9 and capacity electrodes 10b are made conductive by the carbon bump electrodes 27.

Next, details of a method of manufacturing the above radiation detector 1 will be described with reference to FIG. 4.

The common electrode 5 of the radiation detector 1 is laminated and formed on a surface of the support substrate 3 by a method such as sputtering or vapor deposition, for example. Similarly, the electron or hole blocking layer 7 is laminated and formed on a surface of the common electrode 5. And the conversion layer 8 is formed by sublimation technique on a surface of the electron or hole blocking layer 7. First, a method of preparing a source for forming the conversion layer 8 by sublimation technique will be described in detail hereinafter.

Step S1 (Prepare Cl-Doped CdTe Single Crystal)

Conventionally, there are Czochralski method (CZ method), traveling heater method (THM method) and Bridgman method as methods of preparing single crystals. By these crystal preparing methods, CdTe crystal doped with Cl is grown in a concentration of 1-100 ppm. At this time, crystal defects such as point defects and area defects may be included in the Cl-doped CdTe crystal grown and prepared.

Step S2 (Grind to Fixed Particle Size)

Next, the Cl-doped CdTe crystal is ground to a fixed particle size distribution to produce a powder of the Cl-doped CdTe crystal. This powder is the main material in this embodiment. Step S2 corresponds to the first powder preparing step in this invention.

Apart from this, further as an auxiliary material doped with Cl, a powder is prepared by grinding $CdCl_2$ or $ZnCl_2$ to the same grain size distribution as the main material. This powder serves as the first auxiliary material.

Further, as an auxiliary material doped with Zn, powder is prepared by grinding Zn, ZnTe or $ZnCl_2$ to the same particle size as the main material. This powder serves as the second auxiliary material.

Step S3 (Mix Main Material with First Auxiliary Material and Second Auxiliary Material)

A mixture is prepared by mixing uniformly the main material, first auxiliary material and second auxiliary material described above in a fixed ratio. Step S3 corresponds to the second mixture preparing step in this invention.

Step S4 (Prepare Mixed Sintered Body)

A mixed sintered body is prepared by heat-treating the above mixture in a pressure-controlled chamber. This mixed sintered body serves as the source of a film forming material.

Step S5 (Form Polycrystalline Semiconductor)

Next, a 300-600 μm thick film is formed by proximity sublimation method as the radiation conversion layer. The proximity sublimation method is one technique of physical vapor deposition, and is a method used for forming CdTe film as photoelectric conversion film for solar cells. By heating the source (sintered body) of a film-forming material placed close and opposite to a substrate for film formation, a semiconductor consisting of the sublimate of the source is formed as a film on the substrate. Since the source is placed close to the substrate in this proximity sublimation method, a semiconductor of large area can be formed relatively easily.

A Cl-doped CdZnTe polycrystalline semiconductor film is formed by placing the film-forming surface of the support substrate 3 for film formation close and opposite to the source, and heating and controlling the source and support substrate 3 independently in a pressure-controlled chamber. Step S5 corresponds to the polycrystalline semiconductor film forming step in this invention.

By changing the mixing ratio of the powder materials of the main material, auxiliary material 1 and auxiliary material 2 which are the source of the above proximity sublimation method, the Cl concentration and the component percentage of Zn in the CdZnTe polycrystalline semiconductor film can be changed, and can be optimized according to required characteristics.

Step S6 (Further Dope with Cl in Gaseous Phase)

By heating, while supplying a vapor including Cl atoms, the Cl-doped CdZnTe polycrystalline semiconductor film prepared as described above is further doped with Cl.

Specifically, the CdZnTe polycrystalline semiconductor film is doped with Cl by performing heat treatment at 480° C. for one hour, with the powder including at least one of $CdCl_2$ and $ZnCl_2$ or its sintered body placed opposite and close to a polycrystalline film surface.

The heat-treating atmosphere at this time, preferably, is an atmosphere maintained at one atmospheric pressure and including at least one of $N_2$, $O_2$, $H_2$ and a rare as (helium, Ne, Ar). It is further preferred that the heat-treating atmosphere at this time is an atmosphere maintained at $1.3 \times 10^{-4}$ to 0.5 atmospheric pressure and including at least one of $N_2$, $O_2$, $H_2$ and a rare gas (helium, Ne, Ar).

Since treatment can be carried out at low temperature by using such an atmosphere, dark current can be reduced further. Further, by maintaining the same temperature, more Cl can be supplied and treatment can be done in a short time.

As described above, since Cl is further doped after doping Cl at the time of forming the CdZnTe polycrystalline semiconductor film, protection of crystal grain boundaries is carried out with increased effect. Consequently, characteristics of the radiation detector 1 can be further improved while reducing dark current. Step S6 corresponds to the gaseous phase Cl doping step in this invention.

Step S7 (Film Surface Flattening Process)

To enable bonding to the active matrix substrate 11, a flattening process is carried out by polishing the CdZnTe polycrystalline semiconductor film surface.

Next, after laminating and forming metallic film for pixel electrodes 9 by sputtering, vapor deposition or the like, patterning is carried out to form the pixel electrodes 9. The radiation detector 1 is formed through the above process. And, as described above, the active matrix substrate 11 and radiation detector 1 are integrated to complete the radiographic apparatus.

The Cl-doped CdZnTe polycrystalline semiconductor film prepared as described above is superior to the Cl-doped CdZnTe polycrystalline semiconductor film prepared by the conventional process in sensitivity and response to radiation. FIGS. 5-7 are views showing the sensitivity and response to X-rays of the Cl-doped CdTe polycrystalline semiconductor film prepared by the conventional process and the Cl-doped CdTe polycrystalline semiconductor film prepared in this embodiment.

FIG. 5 shows the sensitivity to X-rays of the Cl-doped CdTe polycrystalline semiconductor film prepared by the conventional process. The main material is a powder of CdTe, and a powder of $CdCl_2$ is used as an auxiliary material. The concentration of Cl dope in the laminated conversion layer 8 is 2 ppm, and Cl doping in the gaseous phase is not carried out. These are sensitivity response waveforms when a negative bias is applied to the common electrode 5 and the radiation detector 1 having the above Cl-doped CdTe polycrystalline semiconductor film is irradiated with X-rays for one second. The graph of black circles is a sensitivity response when X-ray irradiation is made from the active matrix substrate side, which reflects mainly a mobility of electrons. The graph of black rhombuses is a sensitivity response when X-ray irradiation is made from the side of the conversion layer 8, which reflects mainly a mobility of holes.

FIG. 6 shows the sensitivity to X-rays of the Cl-doped CdTe polycrystalline semiconductor film prepared according to this embodiment. The main material is a powder of CdTe doped with Cl, and no auxiliary material is added. The Cl-doped CdTe polycrystalline semiconductor film has been prepared only from the main material. The concentration of Cl dope is 2 ppm, and Cl doping in the gaseous phase is not carried out. Measuring conditions are the same as in the conventional example (FIG. 5).

When FIGS. 5 and 6 are compared, the Cl-doped CdTe polycrystalline semiconductor film prepared in this embodiment (FIG. 6) has higher sensitivity to X-ray irradiation than what has been prepared in the conventional example (FIG. 5). It is also seen that, since there is little difference in sensitivity due to the directions of X-ray irradiation, not only electrons but holes have good mobility, which contributes to sensitivity.

FIG. 7 shows the applied electric field dependence of the X-ray sensitivity of the Cl-doped CdTe polycrystalline semiconductor films. The Cl-doped CdTe polycrystalline semiconductor film according to this embodiment rises with a low electric field, compared with the conventional example. This shows that the sensitivity to X-rays is high, and the charge transport characteristic (carrier mobility) is excellent.

Based on the above, compared with the conventional example, the Cl-doped CdTe polycrystalline semiconductor film prepared according to this embodiment has higher sensitivity to X-rays, and is superior in X-ray sensitivity even with a low voltage applied to the common electrode 5. This shows that the Cl-doped. CdTe polycrystalline semiconductor film prepared by grinding the Cl-doped CdTe crystal prepared by doping with Cl and preparing a polycrystalline film again from this powder is superior to the Cl-doped CdTe polycrystalline semiconductor film prepared by doping the CdTe polycrystalline semiconductor film with Cl in sensitivity and response to X-rays, although the concentration of Cl dope is the same.

From this experimental result, the conventional example and this embodiment are considered different in the mechanism of Cl protecting the defect level of the CdTe polycrystalline semiconductor film. That is, the conventional Cl-doped CdTe polycrystalline semiconductor film prepared by doping the CdTe polycrystalline semiconductor with Cl is considered to have the defect level of crystal grain boundaries protected by Cl. On the other hand, the Cl-doped CdTe polycrystalline semiconductor film prepared by grinding the Cl-doped CdTe crystal prepared by doping with Cl and preparing the Cl-doped CdTe polycrystalline semiconductor film again from this powder, in this embodiment, is considered to have the defect, level in crystal grains protected. Thus, in this application, a new mechanism of protecting the defect level by Cl in the polycrystalline semiconductor film not known in the prior art has been invented.

The radiation detector 1 constructed as described above can effectively protect, by Cl, the defect level in the crystal grains existing in the polycrystalline semiconductor film, by forming the polycrystalline semiconductor film by using, as a source, the powder made by grinding the Cl-doped CdTe single crystal. Consequently, carrier mobility obstructive factors can be eliminated or lessened, to effectively improve detection characteristics (sensitivity, response and so on) of the polycrystalline semiconductor film relative to radiation. Further, the defect level of crystal grain boundaries can also be protected effectively by mixing an auxiliary material including Cl atoms into the source which forms the polycrystalline semiconductor film, or by further doping with Cl using a different technique such as doping the formed polycrystalline semiconductor film with Cl atoms in a vapor phase state. The resistivity of the polycrystalline semiconductor film can also be changed by mixing an auxiliary material including Zn atoms into the source which forms the polycrystalline semiconductor film. These features can provide a radiation detector excellent in sensitivity and response to radiation, noise, dark current characteristic and S/N, and a radiographic apparatus with high image quality and excellent in detection efficiency.

This embodiment realizes also a radiation detector of a large area of 10 cm square or larger, especially 20 cm square or larger, which has been considered difficult to prepare with single crystal.

This invention is not limited to the foregoing embodiment, but may be modified as follows:

(1) In the foregoing embodiment, the powder of Cl-doped CdTe single crystal is used as the main material. However, a powder of Cl-doped CdZnTe single crystal, a powder of Cl-doped CdTe polycrystal and a powder of Cl-doped CdZnTe polycrystal may be used. The main material may be a powder of either crystals of an ingot or crystals of a slice. This allows use of reject crystals in a manufacturing process, thereby to cut the cost of products.

(2) In the foregoing embodiment, the radiation conversion layer has a single layered structure of the Cl-doped CdTe polycrystalline semiconductor film or Cl-doped CdZnTe polycrystalline semiconductor film. However, a two-layer structure film of these may be used. The first layer may be the Cl-doped CdTe polycrystalline semiconductor film, and the second layer may be the Cl-doped ZnTe polycrystalline semiconductor film.

(3) In the foregoing embodiment, the mixture of the main material, first auxiliary material and second auxiliary material, is used as the source of the polycrystalline semiconductor film. However, only the main material may serve as the source, or a mixture of the main material and first auxiliary material or a mixture of the main material and second auxiliary material may serve as the source.

(4) In the foregoing embodiment, the polycrystalline semiconductor film is constructed as the radiation detector. Instead of being limited to radiation, a light detector may be constructed for visible light, ultraviolet light, gamma rays and so on.

(5) In the foregoing embodiment, the proximity sublimation method has been described as an example of physical vapor deposition. There is no limitation as to forming of the semiconductor by vapor deposition, as exemplified by sputtering, CVD, sublimation method, chemical deposition method and so on.

The invention claimed is:

1. A radiation detector manufacturing method comprising a first powder preparing step for preparing a first powder by grinding CdTe crystal doped with Cl or CdZnTe crystal doped with Cl, and is polycrystalline semiconductor film forming step for forming a polycrystalline semiconductor film, by vapor deposition or sublimation method using the first powder as a source, from at least one of Cl-doped CdTe or Cl-doped CdZnTe, the polycrystalline semiconductor film serving as a radiation conversion layer.

2. The radiation detector manufacturing method according to claim 1. comprising, after the first powder preparing step, a first mixture preparing step for adding to the first powder, as a second powder, one of $CdCl_2$ and $ZnCl_2$ which is a Cl-doped first auxiliary material, thereby preparing a first mixture of the first powder and the second powder, the polycrystalline semiconductor film forming step being executed to form the polycrystalline semiconductor film by vapor deposition or sublimation method using the first mixture as the source.

3. The radiation detector manufacturing method according, to claim 1, comprising, after the first powder preparing step, a mixture preparing step For adding to the first powder, as a second powder, one of $CdCl_2$ and $ZnCl_2$ which is a Cl-doped first auxiliary material, and as a. third powder, one of Zn, ZnTe and $ZnCl_2$ which is a Zn-doped second auxiliary material, thereby preparing a mixture of the first powder, the second powder and the third powder, the polycrystalline semiconductor film forming step being executed to form the polycrystalline semiconductor film by vapor deposition or sublimation method using the mixture as the source.

4. The radiation detector manufacturing method according to claim 1, comprising, after the first powder preparing step, a mixture preparing step for adding to the first powder, as a second powder, one of Zn, ZnTe and $ZnCl_2$ which is a Zn-doped second auxiliary material, thereby preparing a mixture of the first powder and the second powder, the polycrystalline semiconductor film forming step being executed to form the polycrystalline semiconductor film by vapor deposition or sublimation method using the mixture as the source.

5. The radiation detector manufacturing method according, to any one of claims 1 to 4, comprising, after the polycrystalline semiconductor film forming step, a gaseous phase Cl doping step for further doping the polycrystalline semiconductor film with Cl by supplying a vapor including Cl atoms.

6. The radiation detector manufacturing method according to claim 5, wherein the gaseous phase Cl doping step is executed to perform heat treatment in an arbitrary atmosphere for a powder of $CdCl_2$ or $ZnCl_2$ or a sintered body thereof placed opposite the polycrystalline semiconductor film.

7. The radiation detector manufacturing method according to claim 6, wherein the arbitrary atmosphere in which the heat treatment is performed is one of a rare gas, $N_2$, $O_2$ and $H_2$ or a mixed atmosphere formed of at least two or more thereof.

8. The radiation detector manufacturing method according, to claim 7, wherein the rare gas is one of He, Ne and Ar.

9. A radiation detector comprising, as a radiation conversion layer, a polycrystalline semiconductor film formed by vapor deposition or sublimation method using, as a source, a first powder prepared from at least one of Cl-doped CdTe or Cl-doped CdZnTe, the first powder being prepared by grinding CdTe crystal doped with Cl or CdZnTe crystal doped with Cl.

10. A radiographic apparatus for imaging radiation, comprising a radiation detector including, as a radiation conversion layer, a polycrystalline semiconductor film formed by vapor deposition or sublimation method using a powder as a source, from at least one of Cl-doped CdTe or Cl-doped CdZnTe, the powder being prepared by grinding, CdTe crystal doped with Cl or CdZnTe crystal doped with Cl; charge storage capacity elements for storing electric charges generated by the radiation conversion layer; switching elements electrically connected to the charge storage capacity elements; a drive circuit for causing switching operation through electrode wiring connected to the switching elements; and a readout circuit for reading the electric charges stored in the charge storage capacity elements through electrode wiring connected to the switching elements, wherein the charge storage capacity elements and the switching elements are arranged in a two-dimensional array.

* * * * *